United States Patent
Duarte et al.

(10) Patent No.: US 10,865,957 B2
(45) Date of Patent: Dec. 15, 2020

(54) SYSTEM FOR THE ELECTRICALLY CONNECTING AT LEAST ONE LIGHT SOURCE TO AN ELECTRICAL POWER SUPPLY SYSTEM

(71) Applicant: Valeo vision, Bobigny (FR)

(72) Inventors: Marc Duarte, Villemomble (FR); Eric Mornet, Nogent sur Marne (FR); Sylvain Yvon, Paris (FR); Jonathan Blandin, Les Pavilions Sous Bois (FR)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 16/594,465

(22) Filed: Oct. 7, 2019

(65) Prior Publication Data

US 2020/0041105 A1 Feb. 6, 2020

Related U.S. Application Data

(63) Continuation of application No. 15/037,309, filed as application No. PCT/EP2014/072343 on Oct. 17, 2014, now abandoned.

(30) Foreign Application Priority Data

Oct. 18, 2013 (FR) ...................... 13 60174

(51) Int. Cl.
*F21S 45/47* (2018.01)
*H01L 33/62* (2010.01)
(Continued)

(52) U.S. Cl.
CPC ............. *F21S 45/47* (2018.01); *F21S 41/151* (2018.01); *F21S 41/192* (2018.01); *F21S 43/14* (2018.01);
(Continued)

(58) Field of Classification Search
CPC ...... F21V 19/005; F21V 23/003; F21S 43/14; F21S 41/192; F21S 41/141; F21S 45/47;
(Continued)

(56) References Cited

U.S. PATENT DOCUMENTS

| | | | |
|---|---|---|---|
| 5,010,463 A | 4/1991 | Ross | |
| 6,465,961 B1 * | 10/2002 | Cao | F21V 3/00 315/58 |
| 6,737,811 B2 * | 5/2004 | Zhang | F21K 9/232 315/56 |
| 7,614,771 B2 * | 11/2009 | McKechnie | H05B 47/19 362/543 |

(Continued)

FOREIGN PATENT DOCUMENTS

| | | |
|---|---|---|
| FR | 2906347 A1 | 3/2008 |
| WO | 2011/078217 A1 | 6/2011 |

*Primary Examiner* — Bryon T Gyllstrom
(74) *Attorney, Agent, or Firm* — Oblon, McClelland, Maier & Neustadt, L.L.P.

(57) ABSTRACT

A system for electrically connecting at least one light source to a system for supplying electrical power, wherein the connecting system comprises a lead frame able to be electrically connected to a system for supplying electrical power, the lead frame including at least one connecting terminal and at least one connecting means allowing the connecting terminal of the lead frame to be electrically connected to the light source, the connecting terminal and the connecting means being able to electrically connect the light source to the lead frame, thereby allowing the light source to be placed away from the lead frame.

20 Claims, 1 Drawing Sheet

Figure 1:
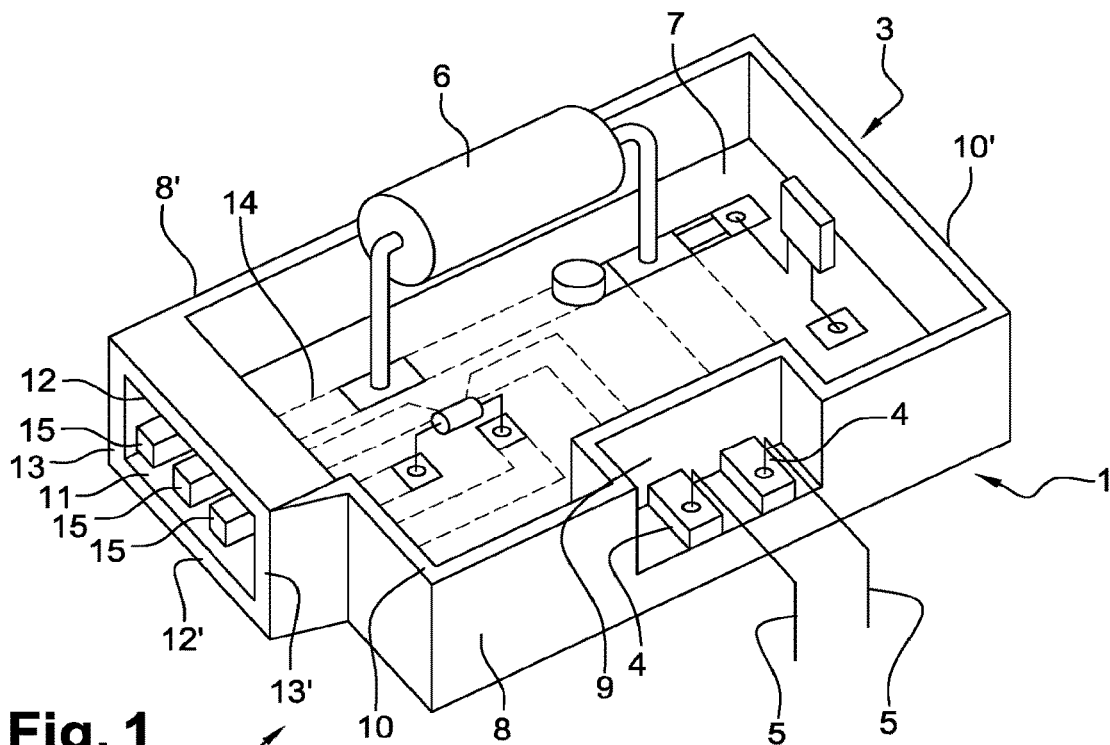

(51) Int. Cl.
*F21S 43/14* (2018.01)
*F21S 41/19* (2018.01)
*F21S 43/19* (2018.01)
*F21S 41/151* (2018.01)
*F21V 19/00* (2006.01)
*F21V 23/00* (2015.01)
*H01L 25/075* (2006.01)
*H01L 33/64* (2010.01)
*H05K 1/02* (2006.01)

(52) U.S. Cl.
CPC ........ *F21S 43/195* (2018.01); *F21V 19/0025* (2013.01); *F21V 23/003* (2013.01); *H01L 25/0753* (2013.01); *H01L 33/62* (2013.01); *H01L 33/647* (2013.01); *H01L 33/641* (2013.01); *H05K 1/0201* (2013.01); *H05K 2201/10022* (2013.01); *H05K 2201/10106* (2013.01)

(58) Field of Classification Search
CPC .... F21S 43/195; H01L 25/0753; H01L 33/62; H01L 33/647
See application file for complete search history.

(56) References Cited

U.S. PATENT DOCUMENTS

| | | | |
|---|---|---|---|
| 7,758,223 B2 * | 7/2010 | Osawa | F21V 3/00 362/547 |
| 8,080,819 B2 * | 12/2011 | Mueller | F21K 9/00 257/13 |
| 8,319,320 B2 * | 11/2012 | Inoue | F21K 9/00 257/676 |
| 8,382,331 B2 * | 2/2013 | Cheng | F21V 19/0055 362/294 |
| 9,318,674 B2 * | 4/2016 | Hussell | H01L 33/62 |
| 9,322,543 B2 * | 4/2016 | Hussell | H01K 1/00 |
| 9,618,163 B2 | 4/2017 | Power | |
| 2001/0026011 A1 * | 10/2001 | Roberts | B60Q 1/2665 257/678 |
| 2002/0145384 A1 | 10/2002 | Jeganathan | |
| 2002/0191396 A1 * | 12/2002 | Reiff | F21L 4/04 362/246 |
| 2003/0156425 A1 * | 8/2003 | Turnbull | B60L 1/14 362/545 |
| 2006/0002125 A1 * | 1/2006 | Kim | F21V 29/773 362/509 |
| 2008/0149962 A1 | 6/2008 | Kim | |

* cited by examiner

SYSTEM FOR THE ELECTRICALLY CONNECTING AT LEAST ONE LIGHT SOURCE TO AN ELECTRICAL POWER SUPPLY SYSTEM

CROSS-REFERENCE TO RELATED APPLICATIONS

This application is a continuation of U.S. application Ser. No. 15/027,309 filed Apr. 5, 2016, which is the U.S. National Phase application of PCT Application No. PCT/EP2014/072343 filed Oct. 17, 2014, and claims priority to the French Application No. 1360174 filed on Oct. 18, 2013. The entire contents of each of which are incorporated herein by reference.

BACKGROUND OF THE INVENTION

1. Field of the Invention

The subject of the present invention is a system for electrically connecting at least one light source to a system for supplying electrical power.

It typically, but not exclusively, is applicable to a system allowing at least one light emitting diode to be electrically connected to the system for supplying electrical power of a motorized vehicle.

2. Description of the Related Art

Patent application FR 2 906 347 discloses a vehicle light device that comprises a lighting module, this module including:
lighting devices each comprising a light-emitting unit;
a conductive board that includes cavities for receiving the lighting devices, this board allowing the lighting devices to be connected, especially by means of electrical tracks, to a source of electrical power;
a heat-dissipating holder on which the lighting devices are placed;
an adhesive part placed between the dissipating holder and the conductive board, which especially allows the lighting devices to be precisely positioned in the cavities of the conductive board.

It turns out that the conductive board of the lighting module that is the subject of patent application FR 2 906 347 must necessarily comprise the cavities in order to be able to place the lighting devices therein. Additional forming operations must thus be carried out in order to give the conductive board a specific shape.

In addition, in order to preserve the luminous efficacy of the lighting devices, it is recommendable to make use of a system for dissipating heat, such as the heat-dissipating holder, thereby complicating the structure of the lighting module.

SUMMARY OF THE INVENTION

The objective of the present invention is especially to remedy these drawbacks by providing a system for electrically connecting at least one light source such as a light-emitting diode to a system for supplying electrical power, the simplified structure of which especially allows design and production costs to be decreased.

For this purpose, it provides a system for electrically connecting at least one light source to a system for supplying electrical power, wherein the connecting system comprises:

a lead frame able to be electrically connected to a system for supplying electrical power, the lead frame including at least one connecting terminal; and
at least one connecting means allowing the connecting terminal of the lead frame to be electrically connected to the light source,
the connecting terminal and the connecting means being able to electrically connect the light source to the lead frame, thereby allowing the light source to be placed away from the lead frame.

Above and in what follows, a lead frame is a structure of conductive tracks, which structure is of integral construction. This lead frame may for example be a plate stamped to form the electrical tracks, then overmolded on an insulating substrate and the portions of which other than those forming the tracks are separated from the plate after the overmolding.

In this way, the light source is electrically connected to the lead frame while being remote and distant from the latter, thereby advantageously allowing the structure of the lead frame to be simplified. Specifically, it is no longer necessary to make provision for a specific location in the lead frame in order to place therein the light source or to fix to the lead frame a means for specifically dissipating the heat emitted by the light source. An arrangement of the light source away from the lead frame is defined as being an arrangement of the light source at a distance from the lead frame that significantly decreases or even prevents the exposure of the lead frame to the heat emitted by the light source, thereby making it possible to dispense with fastening the lead frame to a means able to specifically dissipate the heat of the light source.

Preferably, the lead frame includes a first means for dissipating heat allowing the heat generated by the lead frame to be dissipated.

Preferably, the first means for dissipating heat is a resistive circuit.

Preferably, the lead frame includes a converter allowing the, especially AC, voltage of the current delivered by the system for supplying electrical power to be converted into an, especially DC, voltage applied to the connecting terminal of the lead frame.

The voltage applied to the connecting terminal is preferably suitable for supplying the light source with power.

The lead frame may include a means for protecting from electromagnetic interference.

The first means for dissipating heat advantageously consists of the converter. In this case, the converter is able to continue to operate normally even in the case of substantial heat dissipation.

Advantageously, the lead frame includes a control circuit that controls the voltage of the current applied to the connecting terminal.

Preferably, the connecting terminal of the lead frame is a connecting pad able to allow the light source to be connected by application of the wire bonding technique. This connection may be achieved by a conductive bridge for example.

Preferably, the connecting means is an electrically conductive wire.

Preferably, the lead frame comprises a printed circuit board to which electronic components may be connected.

This board comprises a plurality of electrical tracks allowing electrical current to be transported, electronic components being soldered to these tracks using connecting pins.

If needs be, the end of the connecting pins of the electronic components passes through through-holes in the board, thereby allowing visual inspection of the quality of the solder joints formed on these ends to be carried out by means of optical devices.

Preferably, the lead frame comprises an advantageously electrically insulating border extending perpendicularly from the board, this border including:
two substantially parallel longitudinal walls; and
two substantially parallel transverse walls, which each connect the two longitudinal walls.

The border and the board advantageously define a seal-tight tray, this tray being filled with a liquefied plastic product.

One of the longitudinal walls of the border may comprise a recess in which the connecting terminal is placed.

Preferably, one of the transverse walls of the border comprises on its external face a protruding housing the walls of which extend substantially perpendicular to the transverse wall, the lead frame including at least one electrical connector placed in this housing, this connector allowing the lead frame to be connected to the system for supplying electrical power.

The external face is here the face directed toward the exterior of the lead frame.

Another subject of the invention is a light-emitting assembly, wherein it comprises:
a system for electrically connecting at least one light source to a system for supplying electrical power according to the invention;
at least one light source; and
a second means for dissipating heat allowing the heat generated by the light source to be dissipated, this second means for dissipating heat being disconnected from the lead frame.

The first means for dissipating heat is advantageously able to dissipate more heat than the second means for dissipating heat.

Preferably, the light source is a light-emitting diode (LED), this light-emitting diode possibly being single- or multi-die diodes.

The second means for dissipating heat is preferably a holder of the light source.

The second means for dissipating heat advantageously consists of a substrate on which the light source is mounted. This holder may for example be made of metal or of ceramic.

According to one variant embodiment of the invention, the second means for dissipating heat comprises a radiator placed near or in contact with the light source, this second means for dissipating heat possibly being associated with a heat pipe joined at one of its ends to the lead frame and at its other end to the radiator. The use of a heat pipe is made possible by virtue of the arrangement of the light source away from the lead frame, which allows bulk at the lead-frame level to be decreased.

According to one variant embodiment of the invention, the second means for dissipating heat includes a radiator and a metal holder of the aforementioned type.

Another subject of the present invention is also a lighting and/or signaling device for an automotive vehicle, wherein it includes a light-emitting assembly according to the invention.

These and other objects and advantages of the invention will be apparent from the following description, the accompanying drawings and the appended claims.

BRIEF DESCRIPTION OF THE ACCOMPANYING DRAWINGS

Other features and advantages of the present invention will become apparent in light of the following examples and appended figures, the examples and figures being given by way of completely nonlimiting illustration.

Figure 2:
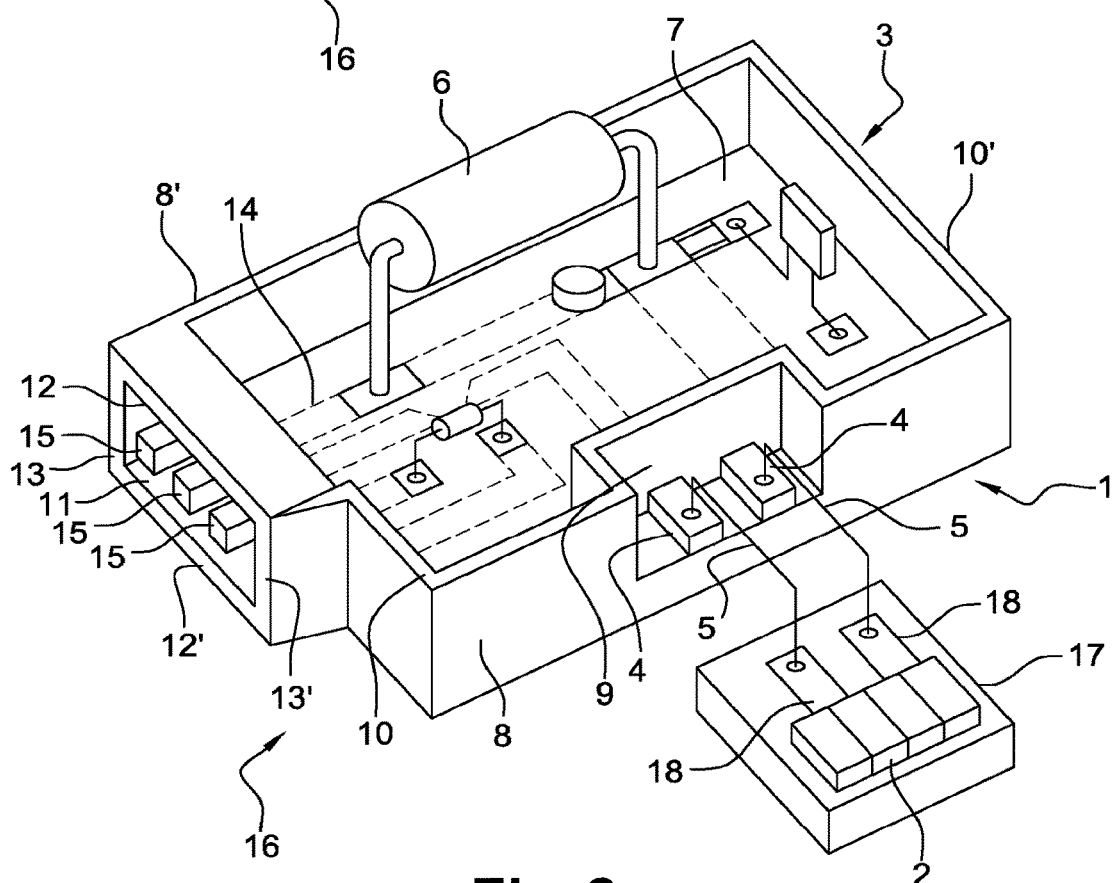

FIG. 1 is a schematic perspective representation of the lead frame of the system according to invention; and FIG. 2 is a schematic perspective representation of the lead frame of the system according to the invention to which a light source is connected.

DETAILED DESCRIPTION OF THE PREFERRED EMBODIMENTS

For the sake of clarity, only elements essential to the comprehension of the invention have been shown schematically and not to scale.

Such as shown in FIG. 1, the electrically connecting system 1 according to the invention includes a lead frame 3 able to be electrically connected to a system for supplying electrical power (not shown) such as the electrical circuit of a vehicle.

The lead frame 3 takes substantially the form of a tray comprising:
a printed circuit board 7 to which electronic components may be connected; and
a border including:
   two substantially parallel longitudinal walls 8, 8', one of these longitudinal walls 8 comprising a recess 9; and
   two substantially parallel transverse walls 10, 10' that each connect the two longitudinal walls 8, 8', one of these transverse walls 10 comprising on its external face a protruding housing 11 the walls of which extend substantially perpendicular to the transverse wall 10, this housing 11 including:
two substantially parallel longitudinal walls 12, 12'; and
two substantially parallel transverse walls 13, 13' each connecting the longitudinal walls 12, 12'.

The board 7 is for example a PCB (printed circuit board) that includes at least one conductive layer overmolded with an electrically insulating material, for example an epoxy resin or fiberglass.

This board 7 comprises electrical tracks 14 allowing electrical current to be transported, these electrical tracks 14 being produced by subjecting the conductive layer of the board 7 to a stamping process.

The lead frame 3 includes electronic components that are generally connected to the board 7 by laser soldering, these electronic components extending, according to the orientation of FIG. 1, above the board 7.

The end of the connecting pins of the electronic components pass through the board 7, thereby allowing visual inspection of the quality of the solder joints formed on these ends to be carried out by means of optical devices.

The lead frame 3 includes at least one electrical connector 15 placed in the housing 11, this connector 15 being connected to at least one of the electrical tracks 14. The connector 15 allows the lead frame 3 to be connected to the system 1 for supplying electrical power. The electrical connector 15 may, for example, be a connecting pad able to allow the system for supplying electrical power to be connected by application of the wire bonding technique.

The lead frame 3 also comprises at least one connecting terminal 4 placed in the recess 9, this connecting terminal 4 being able to interact with a connecting means 5, to electrically connect a light source 2 to the lead frame 3.

The connecting terminal 4 is a connecting pad able to allow the light source 2 to be connected by application of the wire bonding technique, the connecting means 5 being an electrically conductive wire.

In addition, the lead frame 3 includes a first means 6 for dissipating heat allowing the heat generated by the lead frame 3 to be dissipated, this first means 6 for dissipating heat consisting of a resistive circuit.

Furthermore, the lead frame 3 comprises:
means allowing the AC voltage of the current delivered by the system for supplying electrical power to be converted into a DC voltage applied to the connecting terminal 4 of the lead frame 3; and
a switching circuit that controls that voltage of the current which is applied to the connecting terminal 4, the switching circuit possibly for example ensuring that this voltage is comprised in a defined interval.

In this way, the lead frame 3 allows the voltage of the current delivered by the system for supplying electrical power to be converted and adapted in order to apply to the connecting terminal 4 a suitable voltage.

According to one variant embodiment of the invention, the space bounded by the border of the lead frame 3 may be filled with a liquefied plastic product (using a potting process).

Such as is shown in FIG. 2, a lighting assembly 16 according to the invention comprises:
a system 1 for electrically connecting at least one light source 2 to a system for supplying electrical power as described above;
at least one light source 2; and
second means 17 for dissipating heat allowing the heat generated by the light source 2 to be dissipated, this second means 17 for dissipating heat being disconnected from the lead frame 3.

Thus, each connecting means 5 connects one connecting terminal 4 to a conductive pad 18 that is connected to at least one light source 2.

The light source 2 and the conductive pads 18 are placed on the second means 17 for dissipating heat, consisting in the present case of a metal holder.

The light source 2 is a light-emitting diode the emissive portion of which is composed of a semiconductor chip or of a plurality of semiconductor chips, in the first case the diode is what is called a mono-chip diode and in the second case the diode is what is called a multi-chip diode.

Placing the light source 2 away from the lead frame 3 makes it possible to simplify the structure of the lead frame 3, which no longer requires means for specifically dissipating the heat emitted by the light source 2.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A connecting system for electrically connecting at least one light source to a system for supplying electrical power of a motor vehicle, said connecting system comprising:
a circuit board comprising electrical tracks for connecting electronic components to the circuit board;
an electrical connector attached to the electrical tracks and able to be electrically connected to said system for supplying electrical power of a motor vehicle
at least one connecting terminal attached to the electrical tracks and separated from the electrical connector;
a light source holder spaced apart from the circuit board;
a light source of a vehicle light device provided on said light source holder; and
at least one conductive bridge spanning from said at least one connecting terminal to said light source holder such that said at least one connecting terminal is electrically connected to said light source, thereby allowing said light source to be spaced apart from said circuit board.

2. The connecting system as claimed in claim 1, wherein said circuit board includes a first heat dissipater to dissipate heat generated by said circuit board.

3. The connecting system as claimed in claim 2, wherein said first heat dissipater is a resistive circuit.

4. A light-emitting assembly, wherein said assembly comprises:
a connecting system for electrically connecting said at least one light source to said system for supplying electrical power according to claim 2;
a second heat dissipater to dissipate heat generated by said, said second heat dissipater being disconnected from said circuit board.

5. The assembly as claimed in claim 4, wherein said at least one light source is a light-emitting diode.

6. The assembly as claimed in claim 4, wherein said second heat dissipater is said light source holder of said at least one light source.

7. A lighting and/or signaling device for an automotive vehicle, wherein said device includes said light-emitting assembly according to claim 4.

8. The connecting system as claimed in claim 1, wherein said circuit board includes a converter configured to convert an AC voltage delivered by said system for supplying electrical power of a motor vehicle to a DC voltage applied to said at least one connecting terminal.

9. The connecting system as claimed in claim 1, wherein said circuit board includes a control circuit that controls said DC voltage applied to said at least one connecting terminal.

10. The connecting system as claimed in claim 1, wherein said at least one connecting terminal is a connecting pad configured to allow said at light source to be connected to the light source mount by application of a wire bonding technique.

11. The connecting system as claimed in claim 1, wherein said at least one conductive bridge is an electrically conductive wire.

12. The connecting system as claimed in claim 1, wherein said circuit board comprises a printed circuit board to which electronic components may be connected.

13. The connecting system as claimed in claim 1, wherein said circuit board has a substantially rectangular shape, said electrical connector and said at least one connecting terminal being attached to the circuit board at different side of the rectangular shape.

14. The connecting system as claimed in claim 1, wherein said light source holder comprises at least one conductive pad provided on the surface of the light source holder, and electrically connected to said light source.

15. The connecting system as claimed in claim 14, wherein said conductive bridge is attached to said conductive pad.

16. The connecting system as claimed in claim 1, wherein said light source holder is a metal holder.

17. A connecting system for electrically connecting at least one light source to a system for supplying electrical power, said connecting system comprising:
a lead frame able to be electrically connected to said system for supplying electrical power, said lead frame including at least one connecting square terminal disposed outside a border of the lead frame; and at least one connector to allow said at least one connecting terminal of said lead frame to be electrically connected to said at least one light source, said at least one connecting terminal and said at least one connector being configured to electrically connect said at least one light source to said lead frame, thereby allowing said at least one light source to be placed away from said circuit board, wherein:

said lead frame comprises a printed circuit board to which electronic components may be connected, and said border extends perpendicularly from said printed circuit board, said border including:

two substantially parallel longitudinal walls; and two substantially parallel transverse walls, which each connect said two longitudinal walls, wherein the two substantially parallel longitudinal walls, the two substantially parallel transverse walls and the printed circuit board form an open enclosure.

18. The connecting system as claimed in claim 17, wherein said border and said printed circuit board define a seal-tight tray, said tray being potted with a liquefied plastic product.

19. The connecting system as claimed in claim 17, wherein one of said longitudinal walls of said border comprises a recess in which said at least one connecting terminal is placed.

20. The connecting system as claimed in claim 17, wherein one of said transverse walls of said border comprises on its external face a protruding housing the walls of which extend substantially perpendicular to said transverse wall, said lead frame including at least one electrical connector placed in said housing, said at least one electrical connector allowing said lead frame to be connected to said system for supplying electrical power.

* * * * *